(12) United States Patent
Hanabata et al.

(10) Patent No.: US 6,534,235 B1
(45) Date of Patent: Mar. 18, 2003

(54) PHOTOSENSITIVE RESIN COMPOSITION AND PROCESS FOR FORMING PATTERN

(75) Inventors: Makoto Hanabata, Kyoto (JP); Tokugen Yasuda, Kyoto (JP)

(73) Assignee: Kansai Research Institute, Inc., Osaka (JP)

( * ) Notice: Subject to any disclaimer, the term of this patent is extended or adjusted under 35 U.S.C. 154(b) by 0 days.

(21) Appl. No.: 09/699,409

(22) Filed: Oct. 31, 2000

(51) Int. Cl.[7] .............................. G03F 7/023; G03F 7/30
(52) U.S. Cl. ...................... 430/191; 430/192; 430/193; 430/270.1; 430/317; 430/323; 430/325; 430/326
(58) Field of Search .................. 430/270.1, 325, 430/326, 317, 318, 191, 192, 193, 323

(56) References Cited

U.S. PATENT DOCUMENTS 6,114,083 A * 9/2000 Kawamura et al. ...... 430/270.1
6,183,935 B1 * 2/2001 Hanabata et al. ........ 430/270.1

FOREIGN PATENT DOCUMENTS

JP      5-158235      6/1993
JP      11-194491      7/1999

* cited by examiner

*Primary Examiner*—John S. Chu
(74) *Attorney, Agent, or Firm*—Pillsbury Winthrop LLP

(57) ABSTRACT photosensitive resin composition of the present invention is prepared by adding inorganic particles having a functional group and a mean particle size smaller than the wavelength of light for exposure (e.g., about 1 to 100 nm) to a photosensitive resin. The inorganic particles can be of colloidal silica having a functional group. The photosensitive resin composition may be of positive or negative type, and developable with water or an alkali. The amount of the inorganic particles to be used is, relative to 100 parts by weight of the photosensitive resin, about 10 to 500 parts by weight on a solid matter basis. The use of such photosensitive resin composition makes it possible to largely improve oxygen plasma resistance, heat resistance, dry etching resistance, sensitivity, and resolution utilizing a conventional resist or lithography technique.

15 Claims, 1 Drawing Sheet

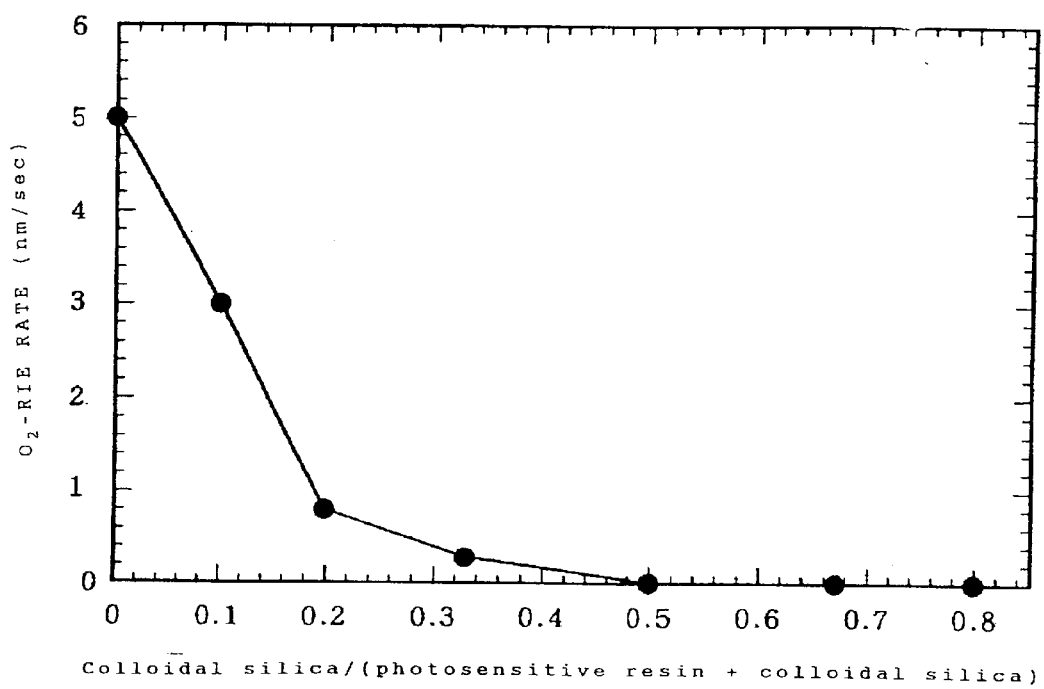

PHOTOSENSITIVE RESIN COMPOSITION AND PROCESS FOR FORMING PATTERN

FIELD OF THE INVENTION

The present invention relates to a photosensitive resin composition (resist composition) that are suitable for forming minute patterns such as semiconductor integrated circuits using, for example, ultraviolet rays or far-ultraviolet rays (including excimer laser), and a process for forming a pattern using the same.

BACKGROUND OF THE INVENTION

With rises in the integration level and performance of semiconductor integrated circuits, there has been demand for resists with better resolution (patterns in submicron order, quartermicron order, or smaller) and for improvements of processing latitude. To meet such demand, improvement of resolution, as well as resists themselves, by employing a conventional lithography technique has been proposed. For example, in the case where the wavelength of light is in the neighborhood of the resolution limit, there is proposed a multi-layer process in which, utilizing the fact that a silicon-containing resist is highly resistant to oxygen plasma, the resolution is improved by oxygen plasma. According to this process, in the case where a double-layered resist is to be formed, on a lower resist layer formed on a substrate is applied a silicon-containing resist such as a vinyl group-containing polysiloxane, the resist is patterned, and then the lower layer (undercoat layer) is etched by oxygen plasma etching.

This process, however, has the drawbacks that synthesis of polysiloxane-based resists rendered photosensitive becomes complicated and thus results in a rise in cost and that it is difficult to control, with good repeatability, the content of silicon giving a large influence on oxygen plasma resistance. The silicon content and the performance of a resist (sensitivity, resolution) are generally in a conflicting relation. That is, increasing the silicon content improves oxygen plasma resistance but deteriorates the performance of a resist. Decreasing the silicon content improves the performance (sensitivity, resolution) of a resin but leads to degradation of oxygen plasma resistance. For such reasons, improving the performance (sensitivity, resolution) of a resist while maintaining the oxygen plasma resistance is difficult.

On the other hand, there have been known compositions comprising an alkali-soluble novolak resin and a diazonaphthoquinone derivative as single resists for semiconductors. Utilizing the characteristic that a diazonaphthoquinone group is decomposed upon irradiation with light of 300 to 500 nm wavelength to form a carboxyl group, allowing the compositions to change from an alkali-insoluble state to an alkali-soluble state, these photosensitive resin compositions have been used as positive resists.

In such semiconductor resists, the most conventional method for achieving miniaturization or minuter integrated circuits is to use an exposure light of a shorter wavelength.

For example, instead of using g-ray (wavelength: 436 nm) or i-ray (Wavelength: 365 nm) of high-pressure mercury lamps generally used, a light source of a shorter wavelength such as KrF excimer laser (wavelength: 248 nm) and ArF excimer laser (wavelength: 193 nm) of next generation have already come into practical use.

However, the use of novolak resin/diazonaphthoquinone-type positive resists having been employed in the production of semiconductor integrated circuits with g-ray or i-ray leads to considerable deterioration in sensitivity and resolution even with KrF excimer laser or ArF excimer laser because of the absorption by the novolak resin. Therefore, the novolak resin/diazonaphthoquinone-type positive resists are lacking in practicability.

Moreover, minute processing with KrF or ArF excimer laser has a number of technical problems to be solved with respect to the choice of, for example, exposing devices such as light sources a lens system, and photosensitive materials (resists). In addition, plant investment for applying the minute processing with KrF or ArF excimer laser to the practical production of semiconductors will be a vast sum of money.

Recently, resists, which are etched, of high-melting point metal substrates (e.g., aluminum-copper, silicides) for use in the fabrication of semiconductors have been required to have higher heat resistance and dry etching resistance than that of conventional novolak resin-series resists. Since resists for KrF or ArF excimer laser processing irreplaceable by novolak resin-based resists are, from a material restriction viewpoint, generally poorer in heat resistance and dry etching resistance than novolak-series resists, improvement of such characteristics has been desired.

SUMMARY OF THE INVENTION

Accordingly, it is an object of the present invention to provide, utilizing a conventional resist or lithography technique, a photosensitive resin composition with improved oxygen plasma resistance, heat resistance, and dry etching resistance; a process for producing the same; and a process for forming a pattern.

It is another object of the present invention to provide, even in the case of resists currently in use, a photosensitive resin composition as a resist with largely improved sensitivity and resolution and useful in forming a minute pattern; a process for producing the same; and a process for forming a pattern.

It is still another object of the present invention to provide a photosensitive resin composition capable of largely improving the profile of a pattern and focus latitude; a process for producing the same; and a process for producing the same.

The inventors of the present invention made intensive and extensive studies to achieve the above-mentioned objects and finally found that the addition of an inorganic substance in the form of uneven particles to a resist made from an alkali-soluble resin or the like largely improves not only its oxygen plasma resistance but also heat resistance and dry etching resistance, and that the use of inorganic particles having a mean particle size transparent to the wavelength of exposure light improves the sensitivity and resolution of a resist. The present invention was accomplished based on the above findings.

That is, the photosensitive resin composition of the present invention comprises a photosensitive resin and inorganic particles having a functional group and is substantially free from a hydrolytic polymerizable organic metal compound or its condensate. The mean particle size of the inorganic particles is usually smaller than the wavelength of light to which the resuting resist is to be exposed, for example about 1 to 100 nm. The inorganic particles can be of colloidal silica. The photosensitive resin composition may be of negative or positive type and is preferably developable with water or an alkali. The amount of the inorganic particles is, on a solid matter content, about 10 to 500 parts by weight relative to 100 parts by weight of the photosensitive resin.

The process of the present invention includes a process for forming a pattern without baking, comprising applying the above-mentioned photosensitive resin composition onto a substrate followed by exposure to light and development. A pattern may be formed through a process comprised of, using the photosensitive resin composition described above as the upper layer in a double-layered resist, exposure to light, development not followed by baking, oxygen plasma treatment using the pattern of the upper layer as a mask, and the transfer of the upper pattern to the lower.

BRIEF DESCRIPTION OF THE DRAWINGS

FIG. 1 is a graph showing the relation between the oxygen plasma rate ($O_2$-RIE Rate) and the colloidal silica content of the photosensitive resin composition.

DETAILED DESCRIPTION OF THE INVENTION

The photosensitive resin composition (or resist composition) of the present invention comprises a photosensitive resin and inorganic particles having a functional group. In the specification, the term "photosensitive resin" is a synonym for a photosensitive oligomer or polymer.
[Photosensitive Resin]

The photosensitive resin (A) may be of positive or negative type, and a photosensitive resin of either type will do. The photosensitive resin (A) may comprise: (A1) a resin (oligomer or polymer) which itself is photosensitive, or (A2) a photosensitive resin composition comprising a base resin (oligomer or polymer) and a photosensitizer. Usually, the latter is utilized.

Examples of the resin (A1) which itself is photosensitive are diazonium salt group-containing polymers, azido group-containing polymers, and polymers having a photodimerizable functional group such as cinnamoyl group or cinnamylidene group (e.g., polyvinyl cinnamates).

As the base resin (A2), a variety of polymers having a polar or non-polar group. Preferred photosensitive polymers has a polar group, for example, hydroxyl group, an alkoxy group, carboxyl group, an ester group, an ether group, a carbonate group, amide group or an N-substituted amide group (e.g., —NHC(O)—, >NC(O)—), nitrile group, glycidyl group, or a halogen atom. The photosensitive polymer may be a polymerizable oligomer or polymer having a polymerizable group such as (meth)acryloyl group and allyl group.

Examples of the hydroxyl group-containing polymer and a derivative thereof are polyvinyl alcohol-series polymers, polyvinyl acetals, ethylene-vinylalcohol copolymers, phenolic resins, novolak resins (e.g., phenol novolak resins), polyvinyl phenolic resins, methylolmelamine, and derivatives thereof (e.g., acetalized polymers or compounds, hexamethoxymethylmelamine), and hydroxyl group-containing cellulose derivatives (e.g., hydroxyethylcellulose, hydroxypropylcellulose). Examples of the carboxyl group-containing polymer and a derivative thereof are homopolymers and copolymers containing a polymerizable unsaturated carbonic acid, their esters (e.g., homo- or copolymers of (meth)acrylic acid, maleic anhydride, or of itaconic acid, and esters thereof, and carboxyl group-containing cellulose derivatives (e.g., carboxymethylcellulose or a salt thereof). Examples of the ester group-containing polymers are homo- or copolymers containing a monomer such as a vinyl ester (e.g., vinyl acetate) and a (meth)acrylic acid ester (e.g., methyl methacrylate), (e.g., polyvinyl acetate, ethylene-vinyl acetate copolymer, and (meth)acrylic resins); saturated polyesters; unsaturated polyesters; vinyl ester resins; diallyl phthalate resins; and cellulose esters (e.g., cellulose acetate, cellulose propionate. Examples of the polymer having an ether group are polyalkyleneoxides, polyoxyalkylene glycols, polyvinyl ethers, silicon resin, and cellulose ethers (methylcellulose, ethylcellulose). As the carbonate group-containing polymer, there may be exemplified bisphenol A-based polycarbonates.

As the polymer having an amide group or a substituted amide group, there may be exemplified polyoxazoline or N-acylated polyalkylene imines (polymers corresponding to the above polyoxazoline, such as polymers having an N-acylamino group such as N-acetylamino group and N-polypropionylamino group); poly(vinylpyrrolidone) and derivatives thereof; polyurethane-series polymers; polyureas; nylons or polyamide-series polymers; polymers having a biuret bond; polymers having an allophanate bond; and protein such as gelatin.

As a monomer which constitutes the above polyoxazoline, there may be exemplified 2-oxazoline, 2-substituted-2-oxazolines which has a substituent at 2-position of an oxazoline ring [e.g., oxazolines having a substituent such as $C_{1-4}$ alkyl groups, haloalkyl groups (e.g., dichloromethyl, trichloromethyl, pentafluoroethyl groups), phenyl group, phenyl groups having a substituent (e.g., 4-methylphenyl, 4-chlorophenyl), and $C_{1-4}$ alkoxy-carbonyl groups]. The polyoxazoline may be a homopolymer or copolymer and can be used either singly or in combination. Moreover, the polyoxazoline may be a copolymer in which oxazoline is graft-polymerized on other polymers.

The above polyurethane-series polymers include polyurethanes formed by the reactions of polyisocyanates (e. g. tolylene diisocyanate, hexamethylene diisocyanate, isophorone diisocyanate) with polyols (e.g., polyhydric alcohols such as ethylene glycol, propylene glycol, tetramethylene glycol, and glycerol; polyether polyols such as diethylene glycol, polyethylene glycol, dipropylene glycol, and polypropylene glycol; polyester polyols). The polyureas include polymers formed by the reactions of polyisocyanates with polyamines (e.g., ethylenediamine, diethylenetriamine). The nylons and polyamide-series polymers include polyamides obtained from a lactam component, or a dicarbonic acid component and a diamine component (e.g., nylon 66, nylon 6, nylon 610, nylon 611, nylon 612, and modified nylons thereof), poly(meth) acrylamide-series polymers, and polyamino acids. The polyamides include star-burst dendrimer (D. A. Tomalia.et al., Polymer Journal, 17,117 (1985)).

The polymers having a biuret bond include polymers formed by the reaction of the above polyisocyanate with a compound having, a urethane bond. The polymers having an allophanate bond include polymers formed by the reaction of the above polyisocyanate with a compound having a urea bond. The polymers having a nitrile group include acrylonitrile-series polymers. As a polymer having a glycidyl group, there may be exemplified epoxy resins, homo- or copolymers of glycidyl (meth)acrylate. Examples of the halogen-containing polymer are polyvinyl chlorides, vinyl chloride-vinyl acetate copolymers, vinylidene chloride-series polymers, and chlorinated polypropylenes.

Examples of other organic polymers are polyolefinic resins such as polyethylenes, polypropylenes, carboxyl-modified polyolefines; and styrenic resins such as polystyrenes, styrene-acrylonitrile copolymers, acrylonitrile-butadiene-styrene block copolymers. These polymers can be used either singly or in combination.

As a polymerizable oligomer having a polymerizable group, there may be exemplified derivatives of polyvinylphenol; epoxy(meth)acrylates (e.g., resins formed by the reaction of epoxy resins with (meth)acrylic acid); polyester (meth)acrylates; unsaturated polyester resins; polyurethane (meth)acrylates [e.g., the reaction products of a diol component (e.g., polyalkylene glycol, polyester diol), a diisocyanate (e.g., 2,4-tolylenediisocyanate), and a hydroxyl group-containing polymerizable monomer (e.g., 2-hydroxyethyl methacrylate, N-methyloleacrylamide), the urethane reaction products of a compound having a hydroxyl group and a polymerizable unsaturated group (e.g., hydroxyethylphthalyl (meth)acryalte, trimethylolpropane diallyl ether) with a diisocyanate (e.g., xylylene isocyanate, 2,4-tolylenediisocyanate)]; polymerizable polyvinyl alcohol-series polymers (e.g., the reaction products of polyvinyl alcohols with N-methylolacrylamide); polyamide-series polymers [e.g., prepolymers formed by the reaction of a carboxyl group-containing ester formed through the reaction of a polycarboxylic acid or an anhydride thereof (e.g., pyromellitic acid dianhydride) with a hydroxyl group-containing polymerizable polymer (e.g., allyl alcohol) with, optionally a halogenating agent for converting a carboxyl group to an acid halide group (e.g., thionyl chloride), a diamine (e.g., p,p'-diaminodiphenylether); the reaction products of a carboxyl group-containing polymer (e.g., copolymers of poly(meth)acrylic acid or maleic acid, ethylene-maleic anhydride copolymers) with amino group-containing polymerizable monomers (e.g., allylamine)]; and silicon resin-type polymers. The preferred photosensitive resin (A1) includes urethane (meth)acrylate, etc.

If needed, the photosensitive resins (A1) and (A2) can be used together with a polymerizable monomer or oligomer having a photopolymerizable group. The polymerizable monomer or oligomer includes monofunctional or polyfunctional photopolymerizable compounds. Examples of the photopolymerizable group contained in a photopolymerizable compound are (meth)acryloyl group, acrylamide group, allyl group, vinylether group, vinylthioether group, vinylamino group, glycidyl group, and acetylenically unsaturated group.

Examples of the monofunctional photopolymerizable compounds are alkyl (meth)acrylates such as (meth)acrylic acid, methyl (meth)acrylate, butyl (meth)acrylate, 2-ethylhexyl (meth)acrylate, and lauryl (meth)acrylate, cyclohexyl (meth)acrylate, benzyl (meth)acrylate, dimethylaminoethyl (meth)acrylate, carbitol (meth)acrylate, 2-hydroxyethyl (meth)acrylate, 2-hydroxypropyl (meth) acrylate, glycidyl (meth)methacrylate, (meth)acrylamide, N-methylol (meth)acrylamide, N-diacetone (meth) acrylamide, N,N'-methylene bis (meth)acrylamide, styrene, (meth)acrylonitrile, vinyl acetate, and N-vinylpyrrolidone.

As a polyfunctional photopolymerizable compound, there may be exemplified ethylene glycol di(meth)acrylate, diethylene glycol di(meth)acrylate, triethylene glycol di(meth) acrylate, polyethylene glycol di(meth)acrylate, polypropylene glycol di(meth)acrylate, 1,4-butanediol di(meth) acrylate, neopentyl glycol di(meth)acrylate, 1,6-hexanediol di(meth)acrylate, pentaerythritol di(meth)acrylate, pentaerythritol tri(meth)acryalte, trimethylolpropane tri(meth) acrylate, and pentaerythritol tetra(meth)acrylate. Further, use can be made of tetramethylolmethane tetra(meth) acrylate, (meth)acrylates of 2,2,5,5-tetrahydroxymethylcyclopentanone, (meth)acrylates of diglycidyl phthalate, (meth)acrylates of N,N,N',N'-tetrakis(β-hydroxyethyl)ethylenediamine, the reaction products of transesterification between triglycerol and methylacrylate, urethane-containing (meth)acrylate, unsaturated esters of polycarboxylic acids, unsaturated acid amides, esters with inorganic acids and metal salts, monomers having an acetylenically unsaturated group, and monomers having a glycidyl group.

As a urethane-containing acrylate, there may be exemplified the reaction products of polyisocyanates (e.g., 2,4-tolylenediisocyanate) with hydroxyl group-containing monomers (e.g., 2-hydroxyethyl methacrylate); the reaction products formed by reacting some of the isocyanate groups of a polyisocyanate (e.g., 2,4-tolylenediisocyanate) with a hydroxyl group-containing monomer (e.g., 2-hydroxyethyl methacryate), followed by reacting the rest of the isocyanate groups with an alkanolamine (e.g., triethanolamine); the reaction products formed by reacting benzoin with polyisocyanates (e.g., 2,4-tolylenediisocyanate) and hydroxyl group-containing monomers (e.g., 2-hydroxyethyl methacrylate).

Examples of the unsaturated esters of polycarboxylic acids, there may be mentioned polyfunctional monomers formed by estrifying polycarboxylic acids (e.g., phthalic acid, trimellitic acid, pyromellitic acid) with hydroxyl group-containing monomers (e.g., allyl alcohol, 2-hydroxyethyl methacrylate), such as diallyl phthalate, diallyl isophthalate, diallyl malate, diallyl chrolendate, diallyl adipate, diallyl diglycolate, triallyl cyanurate, diethylene glycol bisallyl carbonate, phthalates of 2-hydroxyethyl methacrylate, trimellitic acid esters of allyl alcohol, compounds formed by first estrifying p-hydroxybenzoic acid with (meth)acryloyl chloride and then adding epoxy-containing monomers (glycidyl methacrylate) thereto.

Examples of the unsaturated acid amides are alkylenebisacrylamides such as N,N'-methylenebisacrylamide and hexamethylenebisacrylamide, condensates of polyamines with unsaturated acids, the reaction products of an unsaturated amide having a hydroxyl group (e.g., N-methylolacrylamide) with a polycarboxylic acid or a polyepoxy. Further, there are also exemplified a reaction product of N-methololacrylamide in the presence of an acidic compound, 1,3,3-trimethyl-1-acryloylaminomethyl-5-acryloylaminocyclohexane, hexahydro-1,3,5-triacryl-S-triazine, N-acryloylhydroxyethylmaleimide, bisacrylamide formed by reacting an oligomer obtained by the reaction of ε-caprolactam with tetramethylenediamine with acrylic acid chloride, N,N'-bis(ε-acryloylhydroxyethyl)aniline, and a reaction product of N-methylolacrylamide with diethylene glycol diglycidyl ether.

As an ester with an iorganic acid or a metal salt, there may be mentioned, for example, zinc acrylate, alcohol-soluble polyamide resins, and bis(2-hydroxyethylmethacrylate) esters of phosphoric acid.

As a monomer having an acetylenically unsaturated group, there may be mentioned, for example, 9-(ω-methoxybutenyl)anthraquinol synthesized from anthraquinone and 1-methoxybuten-3-yne and urethanes formed by reacting 2,4-hexadiyne-1,6-diol with hexylisocyanate.

An example of the monomer having a glycidyl group is bisphenol-A-diglycidyl ether.

The amount of the polymerizable monomer or oligomer having a photopolymerizable group used can be selected from within the range of 5 to 500 parts by weight and preferably about 10 to 300 parts by weight, relative to 100 parts by weight of the above photosensitive resin.

As the photosensitizer in the photosensitive resin (A2), use can be made of various photosensitizers and photopolymerization initiators, depending on the type of the photosensitive resin composition used.

The photosensitizer can be selected, according to the type of the photosensitive resin (positive or negative), from conventional photosensitizers and sensitizers such as diazonium salts (e.g., diazonium salts, tetrazonium salts, polyazonium salts); quionediazides (e.g., diazobenzoquinone derivatives, diazonaphthoquinone derivatives); azide compounds (e.g., aromatic azide compounds, particularly aromatic diazide compounds); photoactive acid generators [e.g., derivatives of sulfonates (e.g., sulfonic esters, salts of Lewis aicds)]; combinations of photoactive acid generators and crosslinking agents (e.g., melamine derivatives such as methylolmelamine and alkoxymethylmelamine); pyrylium salts; thiapyrylium salts; photodimerization sensitizers; photopolymerization initiators [e.g., ketones (e.g., acetophenone, propiophenone, anthraquinone, thioxanthone, benzophenone, and derivatives thereof), benzoin ether and derivatives thereof, acylphosphine oxide]; and dissolution inhibiting agents.

The amount of the photosensitizer which is used can be selected within the range of, relative to 100 parts by weight of the photosensitive resin, about 0.1 to 20 parts by weight, preferably about 1 to 10 parts by weight.

A preferred photosensitive resin composition is developable with water or an alkali, and such composition can prepared from a water- or alkali-soluble resin (polar group-containing polymer), a photosensitizer (e.g., quinonediazides, azide compounds, dissolution inhibitors, photoactive acid generators, crosslinking agents), and, if necessary, a polymerizable monomer or oligomer having a photopolymerizable group.

Typical negative photosensitive resins include combinations of polar group-containing polymers or polymerizable monomers or oligomers having a photopolymerizable group with photosensitizers [e.g., photopolymerization initiators, azide compounds (e.g., aromatic diazide compounds)], and combinations of polymers having a crosslinkable polar group such as hydroxyl group with photoactive acid generators and crosslinking agents. The negative photosensitive resin is preferably developable with water or an alkali.

Typical positive photosensitive resins include combinations of polar group-contaning polymers (e.g., novolak type phenol resins) with photosensitizers such as quinonediazides (e.g., diazobenzoquinone derivatives, diazonaphthoquinone derivatives); and combinations of homo- or copolymers (e.g., polyvinylphenol-series resins) of monomers which produce an alkali-soluble group upon deprotection (particularly, deprotection by an acid generated by an acid generator) with photosensitizers such as photoactive acid generators, and it is preferred that the positive photosensitive resin is developable with water or an alkali.

As the phenol novolak resin, an alkali-soluble novolak resin is usually employed. When utilizing as a resist for semiconductor production, novolak resins conventionally employed in the field of resist can be used. The novolak resin can be obtained by condensing a phenol having at least one phenolic hydroxyl group in the molecule with an aldehyde in the presence of an acid catalyst. Examples of the phenol are alkylphenols (particularly, $C_{1-4}$alkylphenols) such as phenol, o-, m-, and p-cresols, 2,5-, 3,5-, and 3,4-xylenols, 2,3,5-trimethylphenol, ethylphenol, propylphenol, butylphenol, 2-t-butyl-5-methylphenol; dihydroxybenzenes; and naphthols. Examples of the aldehyde are aliphatic aldehydes such as formaldehyde, acetaldehyde, and glyoxal; and aromatic aldehydes such as benzaldehyde and salicylaldehyde.

In the case where a novolak resin is utilized as the positive photosensitive resin (particularly, resists for semiconductor production), of the photosensitizers listed above, the diazobenzoquinone derivative can be obtained by a reaction of 1,2-benzoquinone-4-sulfonyl with a hydroxyl group-containing compound (e.g., a polyhydric phenol), and the diazonaphthoquinone derivative can be obtained by a reaction of 1,2-naphthoquinone-4-sulfonyl or 1,2-naphthoquinone-5-sulfonyl with a hydroxyl group-containing compound (e.g., polyhydric phenol).

The hydroxyl group-containing compound may be a mono- or polyhydric alcohol, or a phenol having at least one hydroxyl group. Examples of phenols are, besides the phenols exemplified in the paragraph referring to the novolak resin, hydroquinone; resorcin; phloroglucin; alkyl esters of gallic acid, 2,4-dihydroxybenzophenone; 2,3,4-trihydroxybenzophenone; tetrahydroxybenzophenones (e.g., 2,3,3',4-tetrahydroxybenzophenone, 2,3,4,4'-tetrahydroxybenzophenone, 2,2',4,4'-tetrahydroxybenzophenone); pentahydroxybenzophenones (e.g., 2,3,3',4,4'-pentahydroxybenzophenone, 2,3,3',4,5'-pentahydroxybenzophenone); polyhydroxytriphenylmethanes such as tri-or tetrahydroxytriphenylmethane [e.g., (3,4-dihydroxybenzylidene)bis(2-t-butyl-5-methoxyphenol), (3,4-dihydroxybenzylidene)bis(2-cyclohexyl-5-methoxyphenol), (3,4-dihydroxybenzylidene)bis(2-t-butyl-4-methoxyphenol), (3,4-diahydroxybenzylidene)bis(2-cyclohexyl-4-methoxyphenol)]; and polyhydroxyflavans (e.g., 2,4,4-trimethyl-2'4'7-trihydroxyflavan, 2,4,4-trimethyl-2'3'4'7,8-pentahydroxyflavan, 6-hydroxy-4a-(2,4-dihydroxyphenyl)-1,2,3,4,4a,9a-hexahydroxanthene-9-spiro-1'-cyclohexane).

As the homo- or copolymer of a monomer which produces an alkali-soluble group upon deprotection, use can be made of a homo- or copolymer of a monomer [particularly, an aromatic or alicyclic monomer having a benzene, cycloalkane, or crosslinked cyclic alicyclic ring (e.g., bi- or tricycloalkane ring such as norbornane, norbornene, adamantane)] which produces an alkali-isoluble group (e.g., carboxyl group, hydroxyl group) upon deprotection (e.g., aromatic resins having a benzene ring such as polyvinyl phenolic resins; alicyclic resins such as polynorbornyl alcohol-series resins and polyadamantyl alcohol-series resins) and is protected by a protective group (e.g., a $C_{1-6}$alkyl group such as t-butyl group; a cycloalkyl group such as cyclohexyl group; an oxacycloalkyl group such as tetrahydrofuranyl and tetrahydropyranyl group; crosslinked cyclic alicyclic group such as norbornyl group, admantyl group, and hydrogenated naphthyl group). As the protective group, for example, t-butyl group, oxacycloalkyl groups, and crosslinked cyclic alicyclic groups are particularly preferred.

Examples of a photoactive acid generator which is used in combination with a homo- or copolymer of a monomer which produces an alkali-soluble group upon deprotection are derivatives of sulfonates [e.g., sulfonates (e.g., arylalkane sulfonates (particularly, $C_{6-10}$aryl$C_{1-2}$alkane sulfonates) such as 1,2,3-tri(methylsulfonyloxy)benzene); arylbenzene phosphonates (particularly, $C_{6-10}$aryltoluene phosphonates which may have a benzoyl group) such as 2,6-dinitrobenzyltoluene sulfonate and benzoin tosylate; aralkylbenzene sulfonates (particularly, $C_{6-10}$aryl-$C_{1-4}$alkyltoluene sulfonates which may have a benzoyl group) such as 2-benzoyl-2-hydroxy-2-phenylethyltoluene sulfonate; disulfones such as diphenylsulfone; Lewis acid salts (e.g., triarylsulfonium salts (particularly, triphenylsulfonium salts) such as triphenylsulfoniumhexafluorophosphate, triphenylsulfoniumhexafluoroantimony, and triphenylsulfoniummethanesulfonyl]; derivatives of phosphonium salts; diarylhalonium salt derivatives [e.g., Lewis acid salts such as diaryliodonium salts (e.g., diphenyliodoniumhexafluorophosphate)]; salts of diazonium derivatives (Lewis acid salts such as p-nitrophenyldiazoniumhexafluorophosphate); diazomethane derivatives; and triazine derivatives. Particularly, Lewis acid salts (e.g., Lewis acid salts such as phosphoniums salts) are preferred.

The photosensitive resin can be selected also according to the wavelength of light to which the composition is to be exposed. For example, in the case of the use of g-ray (436 nm) or i-ray (365 nm) as the light source for exposure, the photosensitive resin may comprise a novolak resin and a quinonediazide (e.g., diazonaphthoquinone derivative).

If KrF excimer laser (248 nm) is employed as the light source for exposure, use can be made of a chemical-amplifying, photosensitive resin composition such as a positive photosensitive resin composition comprised of a polyvinyl phenolic resin derivative and a photosensitizer (e.g., acid generator, dissolution inhibitor), or a negative photosensitive resin composition comprised of a polyvinyl phenolic resin and a photosensitier (e.g., acid generator and crosslinking agent).

In the case of the use of ArF excimer layer (193 nm) as the light source for exposure, use can be made of a chemical-amplifying, photosensitive resin composition, such as a positive photosensitive resin composition comprised of the above-described homo- or copolymer of a monomer which produces an alkali-soluble group upon deprotection (particularly, alicyclic polymers, such as the above-mentioned homo- or copolymers of an alicyclic monomer having a cycloalkane ring, crosslinked alicyclic ring, etc.) and a photosensitizer (e.g., acid generator, dissolution inhibitor) or a negative photosensitive resin composition comprised of the above-mentioned homo- or copolymer of a monomer (e.g., the alicyclic polymers mentioned above) and a photosensitizer (e.g., acid generator and crosslinking agent).

[Inorganic Particles]

The addition of inorganic particles (inorganic filler) having functional group to the photosensitive resin largely improves the oxygen plasma resistance, heat resistance, and dry etching resistance. The addition of the inorganic particles also improves the sensitivity and resolution of the resulting resist. The reason why the sensitivity and resolution are improved is not clear, but may be because the introduction of a functional group (organic functional group) into the inorganic particle (inorganic particulate carrier) enhances the affinity for the photosensitive resin, dispersing the particles homogeneously, making the difference in dissolution rate between non-exposed areas and exposed-areas relatively larger. That is, the reason could be that, in the positive photosensitive resin composition, dissolution of exposed areas are accelerated, whereas that in non-exposed areas is inhibited, and, in the negative photosensitive resin composition, dissolution in exposed-areas is inhibited, whereas that in non-exposed areas is accelerated. Thus, a pattern having a rectangular cross section is formed with a pattern profile of high contrast ($\gamma$-value) and the resolution largely improved. Moreover, even when the patternwise exposure is done slightly out of focus, the focus latitude is largely improved.

The use of inorganic particles having a mean particle size smaller than the wavelength of light to which the resulting resist is exposed (that is, inorganic particles substantially transparent to the wavelength of light to be used for exposure) makes it possible to fill the resin with the inorganic particles in a high concentration without being influenced by absorption, scattering, or reflection of light. In addition, incorporation or introduction of the inorganic particles by mixing makes it possible to control the inorganic particle content (the amount of filling) relative to the photosensitive resin with ease and good accuracy.

Particularly, the use of silica (e.g., colloidal silica) as the inorganic particles increases the silicon content without deteriorating the resist performance (e.g., sensitivity and resolution), improving the oxygen plasma resistance largely.

The inorganic particles can be of any material provided that oxygen plasma resistance, heat stability, dry etching resistance, and other properties are not adversely affected, examples of which are simple metals (e.g., gold, silver, copper, platinum, aluminum), inorganic oxides inorganic carbonates, inorganic sulfates, and phosphates. Examples of the inorganic oxides are silica (e.g., colloidal silica, aerogels, glass), alumina, titania, zirconia, zinc oxide, copper oxide, lead oxide, yttrium oxide, tin oxide, indium oxide, magnesium oxide. Examples of the carbonates are calcium carbonate and magnesium carbonate. As the sulfates, there may be mentioned, for example, barium sulfate and calcium sulfate. The phosphates include calcium phosphate and magnesium phosphate. The inorganic particles include sols and gels prepared by, for example, a sol-gel process. These inorganic particles can be used either singly or in combination.

The shape of the inorganic particles is not limited to sphere land may be spheroid, disk, rod-like, or fibrous. The mean particle size of the particles is usually smaller than the wavelength of light to be used for exposure (that is, substantially transparent toward the wavelength of light used for exposure). The mean particle size of the particles depends on the degree of minuteness of a pattern to be formed and can be selected within the range of, by the BET process, about 1 to 1,000 nm. The mean particle size is usually about 2 to 1,000 nm (particularly, about 5 to 500 nm). Inorganic particles (particularly, colloidal silica) having a mean particle size of, by the BET process, about 1 to 100 nm (e.g., 1 to 50 nm), particularly about 2 to 100 nm (preferably, 5 to 50 nm, more preferably 7 to 30 nm) are advantageously employed. The monodispersed inorganic particles (especially, colloidal silica) are commercially available as organosols (organosilicasol) from, e.g., Nissan Kagaku Kogyo, co. Ltd. under the tradename "Snowtex collidal-silica".

The surface of each inorganic particle is modified by, for example, a functional group [e.g., a group which enhances the affinity for or compatibility with the photosensitive resin (e.g., alkyl group, aryl group), a reactive group (e.g., a hydrolytic polymerizables group, isocyanate group, amino group, mercapto group, epoxy group such as glycidyl group and glycidoxy group, carboxyl group), or a photosensitive group (e.g., a polymerizable group such as (meth)acryloyl group, allyl group, vinyl group)] thereby to inhibit phase separation or provide the particles with a specific function (s). Examples of the hydrolytic polymerizable groups, include $C_{1-10}$ alkoxy groups such as methoxy, ethoxy, propoxy, isopropoxy, butoxy, isobutoxy, pentyloxy, hexyloxy groups and halogen atoms (e.g., bromine atom, chlorine atom). Of these, $C_{1-4}$ alkoxy groups, particularly methoxy group, ethoxy group, and propoxy group (especially, methoxy group and ethoxy group) are preferable. Examples of the photosensitive group include those listed above (e.g., diazonium salt group, azide group, cinnamoyl group, cinnamylidene group, polymerizable groups), with polymerizable groups ((meth)acryloyl group, allyl group, vinyl group) particularly preferred. Incidentally, the particles having a reactive group or photosensitive group as the functional group can also enhance the affinity for or compatibility with the photosensitive resin. It is preferred that the inorganic particle (B1) has a reactive or photosensitive group (particularly, a polymerizable photosensitive group) as a functional group (B2).

The particle having a modifying group (hereinafter, sometimes referred to simply as a functional group) can be constituted of an inorganic particle (B1) and a modifying group (e.g., functional group) introduced thereto (B2). The functional group (B2) can be introduced to the particle through a reaction with a hydrolytic polymerizable organic metal compound or its condensate. The hydrolytic polymerizable organic metal compound usually contains an alkaline earth metal, a transition metal, a rare earth metal, or a metal element of the Groups III to V of the Periodic Table of the Elements. Examples of the preferred metallic element are metal elements of the Groups IIIb, IVa, and IVb, such as aluminium, titanium, zirconium, silicon. Of these, aluminium and silicon (especially, silicon) are particularly preferred. These metals may be present in the compound or its condensate either singly or in combination.

Among the hydrolytic polymerizable organic metal compounds, exemplified as an organic metal compound containing aluminium are trimethoxy aluminate, triethoxy aluminate, and tripropoxy aluminate. As a compound containing titanium, there may be exemplified trimethoxy titanate, tetramethoxy titanate, triethoxy titanate, tetraethoxy titanate, tetrapropoxy titanate, chlorotrimethoxy titanate, chlorotrimethoxy titanate, ethyltrimethoxy titanate, methyltriethoxy titanate, ethyltriethoxy titanate, diethyldiethoxy titanate, phenyltrimethoxy titanate, and phenyltriethoxy titanate. Examples of a compound containing zirconium are zirconates corresponding to the above-mentioned titanium-containing compounds. Among the organic metal compounds, titanium coupling agents and silane coupling agents (specifically, silane coupling agent) are preferred.

Examples of a silicon-containing compound (e.g., silane coupling agent) include the compounds shown by the following formula:

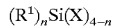

wherein $R^1$ represents an alkyl group having 1 to 4 carbon atoms which may have a substituent, or an aryl group; X represents a halogen atom (e.g., chlorine atom, bromine atom) or $OR^2$; $R^2$ represents an alkyl group having 1 to 4 carbon atoms; $R^1$ and $R^2$ may be the same or different; and n is an integer of 0 to 2.

Examples of the silicon-containing compound (silane coupling agent) are alkoxysilanes (e.g., tri- or tetra$C_{1-4}$alkoxysilanes, specifically tetra $C_{1-4}$alkoxysilanes) such as trimethoxysilane, triethoxysilane, tripropoxysilane, tetramethoxysilane, tetraethoxysilane, and tetrapropoxysilane; alkylalkoxysilanes (e.g., mono- to tri($C_{1-6}$alkyl)tri- to mono($C_{1-4}$alkoxy)silanes, specifically mono- or di($C_{1-4}$alkyl)tri- or di($C_{1-4}$alkoxy)silanes) such as 1-methyl-1,1,1-trimethoxysilane, 1-ethyl-1,1,1-trimethoxysilane, 1-propyl-1,1,1-trimethoxysilane, 1-methyl-1,1,1-triethoxysilane, 1-ethyl-1,1,1-triethoxysilane, 1-propyl-1,1,1-triethoxysilane, 1,1-dimethyl-1,1-dimethoxysilane, and 1,1-diethyl-1,1-diethoxysilane; arylalkoxysilanes (e.g., mono- to tri($C_{6-10}$aryl)tri- to mono($C_{1-4}$alkoxy)silanes, specifically mono- or di($C_{6-10}$aryl)tri- or di($C_{1-4}$alkoxy)silanes) such as 1-phenyl-1,1,1-trimethoxysilane, 1-phenyl-1,1,1-triethoxysilane, 1-phenyl-1,1,1-tripropoxysilane, 1,1-diphenyl-1,1-dimethoxysilane, and 1,1-diphenyl-1,1-diethoxysilane; isocyanate group-containing silane coupling agents such as isocyanatoalkyl group-containing alkoxysilane[e.g., isocyanatoalkylalkoxysilanes (e.g., mono- to tri(isocyanato$C_{1-6}$alkyl)tri- to mono($C_{1-4}$alkoxy)silanes, specifically mono- or di(isocyanato$C_{1-4}$alkyl)tri- or di($C_{1-4}$alkoxy)silanes) typified by 1-(isocyanatomethyl)-1,1,1-trimethoxysilane, 1-(1'- or 2'-isocyanatoethyl)-1,1,1-trimethoxysilane, 1-(1'-, 2'-, or 3'-isocyanatopropyl)-1,1,1-trimethoxysilane, 1-(isocyanatomethyl)-1,1,1-triethoxysilane, 1-(1' or 2'-isocyanatoethyl)-1,1,1-triethoxysilane, 1-(1'-, 2'-, or 3'-isocyanatopropyl)-1,1,1-triethoxysilane, 1-(isocyanatomethyl)-1-methyl-1,1-dimethoxysilane, 1,1-di(isocyanatomethyl)-1,1-dimethoxysilane, 1-(isocyanatoethyl)-1-ethyl-1,1-diethoxysilane, 1,1-di(isocyanatoethyl)-1,1-diethoxysilane; halogen atom and isocyanatoalkyl group-containing alkoxysilanes typified by 1-(isocyanatomethyl)-1-chloro-1,1-dimethoxysilane and halogenated alkyl group and isocyanatoalkyl group-containing alkoxysilanes (e.g., halogenated $C_{1-4}$alkyl group and isocyanato$C_{1-6}$alkyl group-containing $C_{1-4}$alkoxysilanes such as 1-(3'-chloropropyl)-1-(isocyanatomethyl)-1,1-diethoxysilane; aminoalkyl group and isocyanatoalkyl group-containing alkoxysilanes (e.g., amino$C_{1-6}$alkyl group and isocyanato$C_{1-6}$alkyl group-containing $C_{1-4}$alkoxysilanes) typified by 1-(3'-aminopropyl)-1-(isocyanatoethyl)-1,1-dimethoxysilane and 1-(3'-aminopropyl)-1-(isocyanatoethyl)-1,1-diethoxysilane; isocyanatoalkyl group and aryl group-containing alkoxysilanes (e.g., isocyanato$C_{1-6}$alkyl group and $C_{6-10}$aryl group-containing $C_{1-4}$alkoxysilanes) typified by 1-(isocyanatomethyl)-1-phenyl-1,1-dimethoxysilane and 1-(isocyanatopropyl)-1-phenyl-1,1-dipropoxysilane]; mercapto group-containing silane coupling agents [e.g., mercapto group-containing silane coupling agents corresponding to the isocyanate group-containing silane coupling agents enumerated above, particularly mercarptoalkylalkoxysilanes (e.g., mono- to tri(mercapto$C_{1-6}$alkyl)tri- to mono ($C_{1-4}$alkoxy)silanes, specifically mono- or di(mercapto$C_{1-4}$alkyl)tri- to di($C_{1-4}$alkoxy)silanes) typified by 1-(3'-mercarptopropyl)-1,1,1-trimethoxysilane and 1-(3'-mercaptopropyl)-1,1,1-triethoxysilane]; epoxy group-containing silane coupling agents [e.g., epoxyalkylalkoxysilanes (e.g., epoxy group-containing $C_{3-8}$alkyl-$C_{1-4}$alkoxysilanes) typified by 1-(1',2'-epoxypropyl)-1,1,1-trimethoxysilane, 1-(1',2'-epoxypropyl)-1,1,1-triethoxysilane, 1-glycidyl-1,1,1-trimethoxysilane, 1-glycidyl-1,1,1-triethoxysilane, 1-glycidyl-1,1,1-tripropoxylsilane; glycidoxyalkylalkoxysilanes (e.g., glycidoxy$C_{1-6}$alkyl$C_{1-4}$alkoxysilanes) typified by 1-(3'-glycidoxypropyl)-1,1,1-trimethoxysilane and 1-(3'-glycidoxypropyl)-1-methyl-1,1-dimethoxysilane]; amino group-containing silane coupling agents [e.g., amino group-containing silane coupling agents corresponding to the above-listed isocyanate group-containing silane coupling agents, particularly aminoalkylalkoxysilanes in which the nitrogen atom in the amino group may be substituted by an aminoalkyl group (particularly, amino$C_{1-6}$alkyl-$C_{1-4}$alkoxysilanes in which the nitrogen atom of the amino group may be substituted by an amino$C_{1-4}$alkyl group) typified by 1-(3'-(N-(2"-aminoethyl)amino)propyl]-1-methyl-1,1-dimethoxysilane, 1-[3'-(N-(2"-aminoethyl)amino)propyl]-1,1,1-trimethoxysilane, 1-(3'-aminopropyl)-1,1,1-trimethoxysilane, and 1-(3'-aminopropyl)-1,1,1-triethoxysilane]; carboxyl group-containing silane coupling agents,corresponding to the above-listed isocyanate group-containing silane coupling agents; hydroxyl group-containing silane coupling agents corresponding to the above-listed isocyanate group-containing silane coupling agents; halogen atom-containing silane coupling agent corresponding to the above-listed isocyanate group-containing silane coupling agents such as halogenated alkyl group-containing alkoxysilanes (e.g., 1-(3'-chloropropyl)-1,1,1-triethoxysilane).

Of these compounds, the preferred are alkylalkoxysilanes (alkyl group-containing silane coupling agent), arylalkoxysilanes (aryl group-containing silane coupling agent) and the above silane coupling agents containing isocyanate group, epoxy group, mercapto group, amino group and carboxyl group.

It is also preferred that the above organic metal compound has a photosensitive group, and examples of the photosensitive group include those exemplified in the paragraphs referring to the functional group (B2), particularly polymerizable groups.

As a hydrolytic polymerizable organic metal compound having a polymerizable group, there may be mentioned, for example, silane compounds (silane coupling agents) having a polymerizable group such as compounds having a (meth) acryloyl group and a hydrolyzable group [e.g., N-(3-(meth) acryloxy-2-hydroxypropyl)-3-aminopropyltriethoxysilane, 3-(meth)acryloxypropyldimethylmethoxysilane, 3-(meth) acryloxypropyldimethylethoxysilane, 3-(meth) acryloxypropylmethyldiethoxysilane, 3-(meth) acryloxypropyltrimethoxysilane, 3-(meth) acryloxypropylmethylbis(trimethylsiloxy)silane, 3-(meth) acryloxypropyltris(trimethylsiloxy)silane, 3-(meth) acryloxypropyltris(methoxyethoxy)silane, 3-(meth) acryloxypropylmethyldichlorosilane, 3-(meth) acryloxypropyltrichlorosilane, 3-(meth) acryloxypropyldimethylchlorosilane, (meth) acryloxypropenyltrimethoxysilane]; compounds having an allyl group and a hydrolyzable group [e.g., allyltrichlorosilane, allyltriethoxysilane, allyltrimethoxysilane, allyltris(trimethylsiloxy)silane]; compounds having a vinyl group and a hydrolyzable group [e.g., vinyldimethylchlorosilane, vinyldimethylethoxysilane, vinylethyldichlorosilane, vinylmethylbis (methylethylketoximine)silane, vinylmethylbis (trimethylsiloxy)silane, vinylmethyldiacetoxysilane, vinylmethyldichlorosilane, vinylmethyldiethylsilane, vinyltriacetoxysilane, vinyltrichlorosilane, vinyltrimethoxysilane, vinyltriethoxysilane, vinyltriisopropoxysilane, vinyltris-t-butoxysilane, vinyltrimethylsilane, vinyltriphenoxysilane, vinyltris(t-butylperoxy)silane, vinyltrisisopropenoxysilane, vinyltris (2-methoxyethoxy)silane], KBM 1003 (product name, manufactured by Shinetsu Kagaku Kogyo, Co., Ltd.); KBM1063 (product name, manufactured by Shinetsu Kagaku Kogyo, Co., Ltd.); KBM 1103 (product name, Shinetsu Kagaku Kogyo, Co., Ltd.); KBM 1403 (product name, manufactured by Shinetsu Kagaku Kogyo, Co., Ltd.); KBM 503 (product name, manufactured by Shinetsu Kagaku Kogyo, Co., Ltd.); KBM 502 (product name, manufactured by Shinetsu Kagaku Kogyo, Co., Ltd.); KBM 5103 (product name, manufactured by Shinetsu Kagaku Kogyo, Co., Ltd.); KBM 5102 (product name, manufactured by Shinetsu Kagaku Kogyo, Co., Ltd.); and KBM 5403 (product name, manufactured by Shinetsu Kagaku Kogyo, Co., Ltd.).

The organic metal compounds may also be orgnaic metal compounds containing aluminum, titanium, or zirconium corresponding to the above silane coupling agents, e.g., titanium coupling agent, etc. Those commercially available are also usable as the coupling agent.

These hydrolytic polymerizable organic metal compounds can be used either singly or in combination.

Among the organic metal compounds having a hydrolytic polymerizable group and/or a photosensitive group, silicon-containing organic compounds are preferred. Preferred hydrolytic polymerizable organic metal compounds having a photosensitive group are silane compounds having a polymerizable group.

The functional group can be introduced to the inorganic particle (B1) by utilizing a reaction of the inorganic particle (B1) with an organic metal compound having a hydrolytic polymerizable group and/or a photosensitive group (particularly, the above-mentioned hydrolytic polymerizable organic metal compound, among others, silane coupling agents, titanium coupling agents, etc.), surface graft polymerization method, or the CVD method.

The amount of the functional group (B2) introduced to the inorganic particle (B1) can be selected within the range of, in terms of the compound having a functional group (e.g., a silane coupling agent), about 0.1 to 100 parts by weight, preferably about 0.5 to 50 parts by weight, and more preferably about 1 to 20 parts by weight, relative to 100 parts by weight of the inorganic particles (B1).

In the photosensitive resin composition of the present invention, the proportion of the inorganic particles can be selected within the range not adversely affecting sensitivity, the resolution of a pattern, etc., and is usually 5 parts by weight or more relative to 100 parts by weight of the base resin on a solid matter basis (not including a component(s) formed upon heating (e.g., condensed water, alcohol)). The upper limit of the amount of the inorganic particles need only be such that the resulting photosensitive resin composition is capable of forming a film (usually, 1,000 parts by weight or less). The proportion of the inorganic particles is, relative to 100 parts by weight of the base resin, about 10 to 600 parts by weight (e.g., 10 to 500 parts by weight), preferably about 10 to 360 parts by weight, more preferably about 10 to 250 parts by weight, particularly about 10 to 200 parts by weight (e.g., 10 to 150 parts by weight). Even with a content of about 10 to 100 parts by weight (e.g., 10 to 60 parts by weight), high oxygen plasma resistance can be obtained. An inorganic particle content of, relative to the photosensitive resin, 20% by weight or higher largely improves the oxygen plasma resistance. With an inorganic particle content of 50% by weight or higher, the resulting resin composition becomes substantially resistant to etching by oxygen plasma.

[Other Component(s)]

If necessary, the photosensitive resin composition may comprise, besides the photosensitive resin (A) and the inorganic particles (B), a hydrolytic polymerizable metal compound or its condensate.

If necessary, the photosensitive resin composition may contain a photoreaction accelerator (e.g., polymerization accelerator) such as a dialkylaminobenzoic acid or a derivative thereof, triphenylphosphine, and a trialkylphosphine. Moreover, to the composition may be added various additives such as a stabilizer (e.g., antioxidant), a plasticizer, a surfactant, a dissolution accelerator, and a coloring agent (e.g., dyes, pigments). Further, for ease of handling, for example, of coating, the photosensitive resin composition may comprise a solvent (e.g., water, organic solvents such as alcohols, glycols, cellosolves, ketones, esters, ethers, amides, hydrocarbons).

The photosensitive resin composition of the present invention can be prepared in accordance with a conventional method by, for example, mixing a photosensitive resin (A), inorganic particles (B) (inorganic fillers) having a functional group, and, if necessary, other components together. The photosensitive resin composition usually contains a solvent (particularly, a hydrophilic solvent such as an alcohol). The components may be mixed together at the same time or in a suitable order.

[Structure of Photosensitive Layer]

The photosensitive layer can be formed by applying the photosensitive resin composition described above to a substrate. According to the intended pattern and use, the substrate is suitably selected from metals (aluminum), glass, ceramics (alumina, copper doped alumina, tungsten silicate), plastics, and others, and the substrate may be a semiconductor substrate such as silicon wafer.

The surface of the substrate may previously be treated thereby to improve the adhesion with the photosensitive layer, depending on its intended use. The surface treating includes a surface treating method using the silane coupling agent described above or others (e.g., a hydrolytic polymerizable silane coupling agent having a polymerizable group), a coating process with an anchor coating agent or base coat agent (e.g., polyvinyl acetal, acrylic resin, vinyl acetate resin, epoxy resin, urethane resin), or with a mixture of such base coat agent and inorganic finely divided particles, and others.

So that the photosensitive resin composition of the present invention is excellent in oxygen plasma resistance, heat resistance, dry etching resistance, it is preferred that the photosensitive layer is formed at least on the surface of a resist layer. The structure of the photosensitive layer can be selected according to the process of forming patterns or the intended circuit structure, and may be a single- or multi-layered structure (or composite structure). For example, a single-layered photosensitive layer is utilized in a single-layer forming process in which a single photosensitive layer is formed on a substrate and particularly suitable for use in forming a heat-resistant pattern by dry etching. A multi-layered (composite structure) photosensitive layer improves the oxygen plasma resistance largely and therefore is advantageous in improving the resolution even when the wavelength of light for irradiation is at the limit of lithography resolution. For example, a double-layered photosensitive layer is utilized in a double-layer forming process comprising: forming an undercoat resist layer on a substrate, forming a photosensitive layer thereon, exposing the photosensitive layer to light, developing the latent pattern, and etching the undercoat to give a pattern by oxygen plasma or other means. A triple-layered photosensitive layer can be utilized in a multi-layer forming process in which an undercoat layer, an intermediate layer, and a photosensitive are formed on a substrate in this order, exposed to light, and patterned by developing and the intermediate and undercoat layers are then etched. The undercoat and intermediate layers may be made from compositions composed of any photosensitive resin exemplified above and inorganic finely divided particles, or from photosensitive resins containing no inorganic finely divided particle.

The thickness of the photosensitive layer is not particularly restricted and can be selected within the range of about 0.1 to 100 μm, preferably about 0.5 to 50 μm, preferably about 1 to 20 μm, and is usually about 1 to 10 μm (e.g., 1 to 5 μm).

The photosensitive layer can be formed by a conventional coating method such as spin coating, dipping, and casting. If necessary, the coated composition is dried to remove the solvent thereby to form a photosensitive layer.

[Process for Forming Pattern]

Patterning (particularly, minute patterns) can be carried out by a conventional lithography technique which is a combination of exposure, development, and etching. That is a pattern is formed by applying the photosensitive resin composition onto a substrate to form a photosensitive layer, exposing to light, and developing. A pattern may be formed by, using the photosensitive resin composition described above as an upper resist layer in a multi-layered structure (especially, double-layered structure), forming a photosensitive layer on a lower or intermediate layer (particularly, lower layer), patterning the upper photosensitive layer by exposure to light and development, and transferring the pattern of the upper layer to the lower or intermediate layer (particularly, layer) by oxygen plasma through the upper layer as a mask.

The exposure of the photosensitive layer can be carried out according to a conventional method, for example, by irradiating the layer with light or exposing the layer to light through a given mask. As the light for patternwise exposure, use can be made of various light sources (e.g., halogen lamps, high pressure mercury lamps, UV lamps, excimer lasers, other radiations such as electron beam and X-ray), depending on the photosensitive properties of the photosensitive resin composition, the degree of minuteness of the pattern, etc. Usually, lights of wavelengths of about 100 to 500 nm, especially ultraviolet ray or far ultraviolet ray can be employed. The energy for exposure can be selected according to the photosensitive characteristics (e.g., photocurability) of the above photosensitive resin composition, and the exposing time can be selected within the range of about 0.01 second to 20 minutes, preferably about 0.1 second to 1 minute.

A high resolution pattern can be formed by developing the photosensitive layer in a conventional manner after the patterwise exposure. Various developers or developing agents (e.g., water, alkaline solutions, organic solvents, and mixtures thereof) are usable and the choice depends on the type of the photosensitive resin composition (particularly, negative or positive). Preferred developers include water and alkaline developers. If necessary, the developer may contain a small amount of an organic solvent (e.g., hydrophilic or water-soluble solvents such as alcohols typified by methanol, ethanol, and isopropanol; ketones typified by acetone; ethers typified by dioxanes and tetrahydrofurane; cellosolves; cellosolve acetates), a surfactant, and others. There is no particular restriction on the developing process, and the paddle (meniscus) method, dipping method, spraying method, and others are adoptable.

Through a sequence of steps from the application of the photosensitive resin composition to the formation of a pattern, at a suitable step, the coating (photosensitive layer) may be heated or cured at a suitable temperature. If necessary, after the exposure to light, the coating may be subjected to heating.

According to the present invention, at least one of the characteristics, oxygen plasma resistance, heat resistance, dry etching resistance, is improved by adding inorganic particles to a photosensitive organic component.

The present invention is useful for forming a resist pattern (particularly, minute patterns, heat resistant patterns) for the fabrication of a semiconductor integrated circuit, and applicable for use in printing plate materials, ultraviolet ray-curable paints or inks, and others.

According to the present invention, employing a conventional resist or a lithography technique, it is possible to largely improve oxygen plasma resistance, heat resistance, and dry etching resistance through such a simple operation as the addition of inorganic particles. In addition, even in the case of resists currently in use, it is possible to improve sensitivity and resolution largely, and therefore, the resulting resists are useful as resists for forming minute patterns. Further, according to the present invention, pattern, profile and focus latitude are improved significantly.

EXAMPLES

Hereinafter, the present invention will be described in further, detail based on examples, and the examples should by no means be construed as defining the scope of the invention.

Examples 1
1. Preparation of Photosensitive Resin Composition

The following photosensitive resin and inorganic particles (colloidal silica) having a functional group are mixed together in the ratio specified in Table 1 to prepare a photosensitive resin composition.

(1) Photosensitive Resin (i) Novolak resin (base resin): A novolak resin having a weight average molecular weight of 9,500 obtained by reacting meta-cresol, para-cresol, 3,5-xylenol, and formalin according to a conventional method was used.

(ii) Diazonaphthoquinone derivative: A diazonaphthoquinone compound was obtained by reacting a phenol compound shown by the following formula (A):

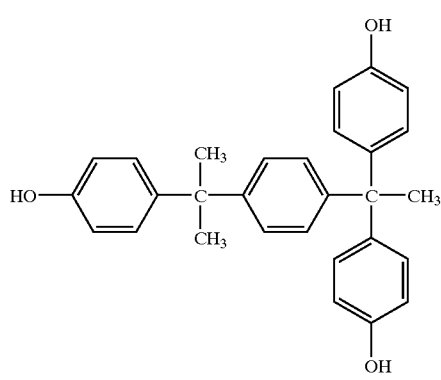

(A)

with naphthoquinone-(1,2)-diazido-(2)-5-sulfochloride in a ratio of the former/the latter=1:1.3 (molar ratio) in dioxane using triethylamine as a catalyst.

A positive photoresist comprised of the novolak resin (15 parts by weight), the diazonaphthoquinone compound (7 parts by weight), and propylene glycol monoethyl ether acetate as a solvent (78 parts by weight) was prepared.

(2) Inorganic Particles (Colloidal Silica) having a Functional Group

As the inorganic particles having a functional group, colloidal silica treated with 3-methacryloxypropyltrimethoxysilane was employed.

The colloidal silica treated with 3-methacryloxypropyltrimethoxysilane was prepared by adding 1.275 g of 3-methacryloxypropyltrimethoxysilane and 111 g of methanol to 25 g of silica particles (organosilicasol, manufactured by Nissan Kagaku Kogyo, Co. Ltd. under the tradename "Snowtex", MEK-ST, colloidal silica-in-methyl ethyl ketone solution with a solid matter content of 30% by weight and a mean particle size of 10 to 20 nm) and stirring the mixture with stirring at room temperatures for 24 hours thereby to introduce photosensitive groups onto the surface of the silica particles. Thereafter, the methanol content was adjusted such that the solid matter content of the particles by weight was 30% by weight. Measurement of the spectrum of the treated silica particles thus obtained by a carbon-13NMR measuring device, JNM-GSX270 (manufactured by Nippon Denshi, Co., Ltd.), revealed the absorption due to the propyl group (10, 16, 24 ppm), methoxy group (50 ppm), methyl group (66 ppm), and carbonyl group (168 ppm) of 3-methacryloxypropyltrimethoxysilan, which confirmed that the photosensitive groups were introduced onto the surface of the silica particles.

2. Pattern Formation and Evaluation of Resist Properties [Sensitivity, Resolution, γ-Value, Heat Resistance, Oxygen Plasma Resistance]

(1) Pattern Formation

The photosensitive resin composition was coated on a washed silicone wafer by means of a spin coater such that a resist layer of 1.6 micron in thickness after dried was formed, and the wafer was baked on a hot plate at 90° C. for 1 minute. Thereafter, the resist layer on the wafer was exposed through a mask having a line-and-space pattern with different line widths, using a reduced projection exposing machine (manufactured by Nikon Kabushilki Kaisha, NSR1755i7A, NA=0.5) having an exposing wavelength of 365 nm (i-line) with the exposure amount varied in steps. The wafer was baked at 110° C. on a hot plate for 1 minute. The wafer was paddle-developed with 2.38% by weight of a tetramethylammonium hydroxide aqueous solution for 1 minute to give a positive pattern.

(2) Evaluation of Properties of Resist

The positive pattern was evaluated for its properties in the following manner.

(i) Sensitivity: expressed in terms of such an amount of exposed dose to print just as the same size of the mask with a line width of 0.4 μm that the ratio of the width of the line to that of the space becomes 1:1 (the smaller the value is, the higher the sensitivity is).

(ii) Resolution: the minimum width of the lines distinctly formed by, without loss of the resist layer, irradiation with such an amount of exposed dose to print just as the same size of the mask with a line width of 0.4 μm that the ratio of the width of the line to that of the space becomes 1:1, measured with a scanning microscope (the smaller the value is, the higher the resolution is).

(iii) γ-value: the slope angle θ was measured by plotting the normalized thickness of a resist layer (the thickness of a residual resist layer/the thickness of the initial resist layer) with respect to the logarithm of the amount of exposure, and tan θ was taken as the γ-value (generally, the higher the γ-value is, the higher the resolution is).

(iv) Heat resistance: the wafers after development were separately placed on hot plates different in temperature for 5 minutes. The temperatures at which the patterns with 500 μm width began to deform were used as indexes of heat resistance (the higher the value is, the higher the heat resistance is).

(v) Oxygen plasma resistance: using a plasma etching device (manufactured by Tokyo Shinku, K.K., SUPER COAT N400), the wafers after development were subjected to oxygen plasma etching under the following conditions.

Feeding System: Cathode Couple, Electrode Size: 80 mmφ
  Gas: oxygen, pressure: 8.645 Pa, rf voltage applied: 85W
  rf electric power density: 1.69 W/cm², treatment time: 5 minutes The film thickness of each wafer was measured. The thickness of the lost portion of the film obtained was divided by the length of etching time to give a value representing the rate of oxygen plasma (O$_2$-RIE rate, nm/sec). The smaller the rate of oxygen plasma is, the higher the oxygen plasma resistance is.

Examples 2 to 3

A photosensitive resin composition was prepared as in Example 1 with the exception the use of, in lieu of the colloidal silica treated with 3-methacryloxypropyltrimethoxysilane used in Example 1, colloidal silica treated with 3-mercaptopropyltrimethoxysilane, and pattern formation and evaluation of the resist properties were carried out. The colloidal silica treated with 3-mercaptopropyltrimethoxysilane was obtained through the surface treatment of silica particles as in Example 1 with the exception that 3-meracptopropyltrimethoxysilane was used in lieu of 3-methacryloxypropyltrimethoxysilane.

Comparative Examples 1 to 5

A photosensitive resin composition was prepared as in Example 1 with the exception of the use of, in lieu of the colloidal silica treated with 3-methacryloxypropyltrimethoxysilane, non-treated colloidal silica (organosilicasol, Nissan Kagaku Kogyo, Co. Ltd. "Snowtedx", MEK-ST, colloidal silica-in-methyl ethyl ketone solution having a solid matter content of 30% by weight and a mean particle size of 10 to 20 nm.), and pattern forming and evaluation of resist properties were carried out.

As Comparative Example 5 being the case of a photosensitive resin composition free from inorganic particles, a resin composition was prepared in the same manner and pattern formation and evaluation of resist properties were carried out.

The results obtained in Examples 1 to 3 and Comparative Examples 1 to 5 are shown in Table 1.

of polyvinylphenol resin having a weight average molecular weight of 8,000 in which 30 mole % of the hydroxyl group is substituted with t-BOC (t-butoxycarbonyloxy group) and mixed with 60 parts by weight of propylene glycol monomethyl ether acetate to prepare a positive photoresist.

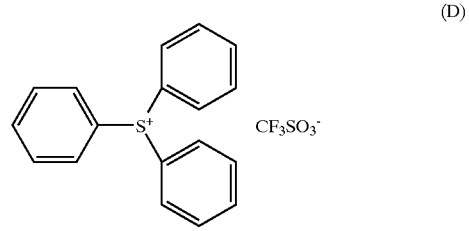

(D)

(2) Inorganic Particles (Colloidal Silica) having a Functional Group

As the inorganic particles having a functional group, the colloidal silica treated with 3-methacryloxypropyltrimethoxysilane of Example 1 was employed.

2. Pattern Formation and Evaluation of Properties of Resist [Sensitivity, Resolution, Heat Resistance, and Oxygen Plasma Resistance]

(1) Pattern Formation

The above photosensitive resin composition was coated on a washed silicon wafer using a spin coater so that the layer after dried became 1.0 μm in thickness, and baked on a hot plate at 80° C. for 1 minute. Thereafter, the layer on the wafer was exposed through a mask having a line-and-space pattern with different line widths using a reduced projection exposing machine (manufactured by Nikon Kabushiki Kaisha, KrF excimer laser stepper, NA=0.45) having an exposing wavelength of 248 nm with the exposure amount varied in steps. The wafer was baked on a hot plate at 100° C. for 1 minute. Further, the resist layer on the wafer was paddle-exposed with 2.38% by weight of a tetramethylam-

TABLE 1

| | Composition (solid matter content weight ratio) | | Sensitivity (msec) | Resolution (μm) | γ-value | Heat resistance (° C.) | O$_2$-RIE rate (nm/sec) |
|---|---|---|---|---|---|---|---|
| | photosensitive resin | colloidal silica | | | | | |
| Ex. 1 | 1 | 0.5 | 130 | 0.30 | 5.5 | 150 | 0.2 |
| Ex. 2 | 1 | 0.5 | 125 | 0.30 | 5.3 | 150 | 0.2 |
| Ex. 3 | 1 | 1 | 115 | 0.28 | 6.5 | 160 | 0.02 |
| Comp. Ex. 1 | 1 | 0.5 | 140 | 0.35 | 3.2 | 150 | 0.3 |
| Comp. Ex. 2 | 1 | 0.11 | 180 | 0.45 | 1.8 | 130 | 3 |
| Comp. Ex. 3 | 1 | 0.25 | 160 | 0.40 | 2.4 | 140 | 0.8 |
| Comp. Ex. 4 | 1 | 1 | 135 | 0.32 | 3.4 | 160 | 0.01 |
| Comp. Ex. 5 | 1 | — | 200 | 0.5 | 1.5 | 110 | 5 |

In FIG. 1, the relation between the O$_2$-RIE Rate and the colloidal silica content of the photosensitive resin composition was shown.

Example 4

1. Preparation of Photosensitive Resin Composition

The following photosensitive resin and inorganic particles having (colloidal silica) a functional group were mixed together in the ratio specified in Table 2 to prepare a photosensitive resin.

(1) Photosensitive Resin (i) 0.002 part by weight of an acid generator represented by the following formula (D) was added to 1 part by weight monium hydroxide aqueous solution for 1 minute to give a positive pattern.

(2) Evaluation of Properties of Resist

The positive pattern was evaluated for its properties in the following manner.

(i) Sensitivity: expressed in terms of such an amount of exposed dose to print just as the same size of the mask with a line width of 0.4 μm that the ratio of the width of the line to that of the space becomes 1:1 (the smaller the value is, the higher the sensitivity is).

(ii) resolution, heat resistance, and oxygen plasma resistance were evaluated as in Example 1.

Examples 5 to 6

A photosensitive resin composition was prepared as in Example. 4 with the exception the use of, in lieu of the colloidal silica treated with 3-methacryloxypropyltrimethoxysilane used in Example 4, colloidal silica treated with 3-glycidoxypropyltrimethoxysilane, and pattern formation and evaluation of resist properties were carried out. The colloidal silica treated with 3-glycidoxypropyltrimethoxysilane was obtained through the surface treatment of silica particles as in Example 1 with the exception that 3-glycidoxypropyltrimethoxysilane was used in lieu of 3-methacryloxypropyltrimethoxysilane.

Comparative Examples 6 to 9

A photosensitive resin composition was prepared as in Example 4 with the exception of the use of, in lieu of the colloidal silica treated with 3-glycidoxypropyltrimethoxysilane, non-treated colloidal silica (organosilicasol, Nissan Kagaku Kogyo, Co. Ltd. "Snowtex", NPC-ST, colloidal silica-in-ethyleneglycolmono-n-propylether solution having a solid matter content of 20% by weight and a mean particle size of 10 to 20 nm.), and pattern forming and evaluation of resist properties were carried out.

As Comparative Example 9 being the case of a photosensitive resin composition free from inorganic particles, a resin composition was prepared in the same manner and pattern formation and evaluation of resist properties were carried out.

The results obtained in Examples 4 to 6 and Comparative Examples 6 to 9 are shown in Table 2.

TABLE 2

| | Composition (solid matter content weight ratio) | | | | Heat | |
| --- | --- | --- | --- | --- | --- | --- |
| | photo-sensitive resin | colloidal silica | Sensitivity (msec) | Resolution (μm) | resistance (° C.) | O2-RIE rate (nm/sec) |
| Ex. 4 | 1 | 0.5 | 50 | 0.25 | 140 | 0.3 |
| Ex. 5 | 1 | 0.5 | 45 | 0.24 | 140 | 0.3 |
| Ex. 6 | 1 | 1 | 40 | 0.23 | 150 | 0.01 |
| Comp. Ex. 6 | 1 | 0.5 | 55 | 0.28 | 140 | 0.4 |
| Comp. Ex. 7 | 1 | 0.11 | 65 | 0.32 | 120 | 4 |
| comp. Ex. 8 | 1 | 0.25 | 60 | 0.30 | 130 | 1.2 |
| Comp. Ex. 9 | 1 | — | 70 | 0.35 | 100 | 7 |

Example 7

1. Preparation of Photosensitive Resin Composition

The following photosensitive resin and inorganic particles (colloidal silica) having a functional group were mixed together in the ratio specified in Table 3 to give a photosensitive resin composition.

(1) Photosensitive Resin (i) A negative photoresist was prepared by mixing 10 parts by weight of hydroxypropylcellulose (manufactured by Nippon Soda, Co., Ltd., HPC-SL), 2.5 parts by weight of trimethylolpropane trimethacrylate (manufactured by Kyoei-kagaku, Co., Ltd., Lightester TMP), 7.5 parts by weight of polyethylene glycol dimethacrylate (manufactured by Kyoei-kagaku, Co., Ltd., Lightester 9EG), 0.5 part by weight of benzoin methyl ether as a polymerization initiator, and 50 parts by weight of ethylene glycol monoethyl ether acetate.

(ii) Inorganic particles (colloidal silica) having a functional group

The colloidal silica treated with 3-methacryloxypropyltrimethoxysilane used in Example 1 was employed as the inorganic particles having a functional group.

2. Pattern Formation and Evaluation of Resist Properties [Sensitivity, Resolution, Heat Resistance, and Oxygen Plasma Resistance]

(1) Pattern Formation

The above photosensitive resin composition was coated on a washed silicon wafer using a spin coater so that the layer after dried became 1.0 μm in thickness, and baked on a hot plate at 80° C. for 1 minute. Thereafter, with the amount of exposure varied in steps, the layer on the wafer was exposed through a mask having a line-and-space pattern with different line widths using a reduced projection exposing machine (manufactured by Nikon Kabushiki Kaisha, stepper, NA=0.54) having an exposing wavelength of 436 nm. The wafer was baked on a hot plate at 100° C. for 1 minute. Further, the resist layer on the wafer was paddle-exposed with 2.38% by weight of a tetramethylammonium hydroxide aqueous solution for 1 minute to give a negative pattern.

(2) Evaluation of Properties of Resist

The negative pattern was evaluated for its properties in the following manner.

(i) Sensitivity: expressed in terms of such an amount of exposed dose to print just as the same size of the mask with a line width of 0.4 μm that the ratio of the width of the line to that of the space becomes 1:1 (the smaller the value is, the higher the sensitivity is).

(ii) resolution, heat resistance, and oxygen plasma resistance were evaluated as in Example 1.

Comparative Examples 10 to 13

A photosensitive resin composition was prepared as in Example 7 with the exception of the use of, in lieu of the colloidal silica treated with 3-methacryloxypropyltrimethoxysilane, non-treated colloidal silica (organosilicasol, Nissan Kagaku Kogyo, Co. Ltd. "Snowtex methanol silicasol", colloidal silica-in-methanol solution having a solid matter content of 30% by weight and a mean particle size of 10 to 20 nm.), and pattern forming and evaluation of resist properties were carried out.

As Comparative Example 13 being the case of a photosensitive resin composition free from inorganic particles, a resin composition was prepared in the same manner, and pattern formation and evaluation of resist properties were carried out.

The results obtained in Example 7 and Comparative Examples 10 to 13 are shown in Table 3.

TABLE 3

| | Composition (solid matter content weight ratio) | | | | Heat | |
| --- | --- | --- | --- | --- | --- | --- |
| | photo-sensitive resin | colloidal silica | Sensitivity (msec) | Resolution (μm) | resistance (° C.) | O2-RIE rate (nm/sec) |
| Ex. 7 | 1 | 0.5 | 50 | 0.5 | 160 | 0.3 |
| Comp. Ex. 10 | 1 | 0.5 | 55 | 0.6 | 160 | 0.5 |
| Comp. | 1 | 0.11 | 80 | 0.8 | 140 | 6 |

TABLE 3-continued

| | Composition (solid matter content weight ratio) | | | | Heat | |
|---|---|---|---|---|---|---|
| | photo-sensitive resin | colloidal silica | Sensi-tivity (msec) | Reso-lution (μm) | resis-tance (° C.) | O2-RIE rate (nm/sec) |
| Ex. 11 comp. Ex. 12 | 1 | 0.25 | 70 | 0.7 | 150 | 1.7 |
| Comp. Ex. 13 | 1 | — | 90 | 1.0 | 120 | 10 |

What is claimed is:

1. A photosensitive resin composition which comprises a photosensitive resin and inorganic particles having a functional group and is substantially free from a hydrolytic polymerizable organic metal compound or its condensate, wherein the inorganic particles having a functional group is obtained by a reaction between inorganic particles and a coupling agent having a functional group.

2. A photosensitive resin composition according to claim 1, wherein the coupling agent is a silane coupling agent.

3. A photosensitive resin composition according to claim 1, wherein the proportion of the coupling agent relative to 100 parts by weight of the inorganic particles is 0.1 to 100 parts by weight.

4. A photosensitive resin according to claim 1, wherein the functional group is at least one member selected from the group consisting of an alkyl group, an aryl group, amino group, mercapto group, epoxy group, carboxyl group, and isocyanate group.

5. A photosensitive resin composition according to claim 1, wherein the mean particle size of the inorganic particles is smaller than the wavelength of light for exposure.

6. A photosensitive resin composition according to claim 1, wherein the mean particle size of the inorganic particles is 1 to 100 nm.

7. A photosensitive resin composition according to claim 1, wherein the inorganic particles are silicasol.

8. A photosensitive resin composition according to claim 1, wherein the photosensitive resin is of positive or negative type and developable with an aqueous developer.

9. A photosensitive resin composition according to claim 8, wherein the aqueous developer is an alkaline aqueous developer.

10. A photosensitive resin composition according to claim 1, wherein the photosensitive resin comprises a base resin and a photosensitizer, and the proportion of the inorganic particles having a functional group is, relative to 100 parts by weight of the base resin, 10 to 600 parts by weight on a solid matter basis.

11. A photosensitive resin composition according to claim 10, wherein the mean particle size of the inorganic particles a having a functional group is 1 to 50 nm and its proportion is 10 to 150 parts by weight relative to 100 parts by weight of the base resin.

12. A photosensitive resin composition, which comprises silicasol having a functional group and a mean particle size of 5 to 50 nm, and a photosensitive resin comprising a base resin and a photosensitizer, wherein the proportion of the silicasol to 100 parts by weight of the base resin is 10 to 360, and is substantially free from a hydrolytic polymerizable organic metal compound or its condensate, wherein the silicasol having a functional group is obtained by a reaction between silicasol and a coupling agent having a functional group.

13. A photosensitive resin composition according to claim 12, wherein the photosensitive resin comprises (1) a combination of a novolak-series phenolic resin and a quinonediazide or (2) a combination of a photoactive acid generator and a homo- or copolymer of a monomer which produces an alkali-soluble group by the action of an acid generated by the acid generator.

14. A process for forming a pattern without calcination, wherein, a photosensitive resin composition recited in claim 1 is applied to a substrate, exposed to light, and developed.

15. A process for forming a pattern, wherein a double-layered resist of which the upper layer is formed with a photosensitive resin composition recited in claim 1 is subjected to exposure to light and development to form a pattern without calcination, and the pattern of the upper layer is transferred to a lower layer by oxygen plasma using the pattern of the upper layer as a mask.

* * * * *